US009781861B2

United States Patent
Tan et al.

(10) Patent No.: US 9,781,861 B2
(45) Date of Patent: Oct. 3, 2017

(54) INFORMATION HANDLING SYSTEM THERMAL CONTROL WITH ADAPTIVE NON-ROTATIONAL COOLING DEVICES

(71) Applicant: Dell Products L.P., Round Rock, TX (US)

(72) Inventors: Geroncio Tan, Austin, TX (US); Travis C. North, Cedar Park, TX (US); Flaviu C. Chis, Austin, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 177 days.

(21) Appl. No.: 14/448,332

(22) Filed: Jul. 31, 2014

(65) Prior Publication Data
US 2016/0037678 A1 Feb. 4, 2016

(51) Int. Cl.
| H05K 7/20 | (2006.01) |
| G05D 23/19 | (2006.01) |
| G06F 1/20 | (2006.01) |
| G06F 1/32 | (2006.01) |

(52) U.S. Cl.
CPC ............. H05K 7/20 (2013.01); G05D 23/19 (2013.01); G06F 1/206 (2013.01); G06F 1/324 (2013.01); G06F 1/3206 (2013.01); Y02B 60/1217 (2013.01); Y02B 60/1275 (2013.01)

(58) Field of Classification Search
None
See application file for complete search history.

(56) References Cited

U.S. PATENT DOCUMENTS

| 6,108,731 | A * | 8/2000 | Suzuki | G06F 1/184 710/104 |
| 7,692,922 | B2 * | 4/2010 | Leija | H01L 23/467 165/185 |
| 9,368,426 | B2 * | 6/2016 | Tanida | F04D 33/00 |
| 2005/0225940 | A1 * | 10/2005 | Walters | G06F 1/20 361/695 |
| 2005/0270739 | A1 * | 12/2005 | Stefanoski | G06F 1/20 361/679.52 |
| 2007/0037506 | A1 * | 2/2007 | Lee | H05K 7/20172 454/184 |
| 2008/0259555 | A1 * | 10/2008 | Bechtolsheim | G06F 13/409 361/679.4 |
| 2009/0190302 | A1 * | 7/2009 | Bhattacharya | G06F 1/20 361/679.47 |
| 2009/0222832 | A1 * | 9/2009 | Sultenfuss | G06F 9/5005 718/104 |

(Continued)

Primary Examiner — Dimary Lopez Cruz
Assistant Examiner — Zhengfu Feng
(74) Attorney, Agent, or Firm — Terrile, Cannatti, Chambers & Holland, LLP; Robert W. Holland

(57) ABSTRACT

A tablet information handling system manages thermal conditions with selective installation of either a wireless wide area network interface card or an air moving device in an internal communication link card slot, such as an M.2 card slot. If an air moving device is installed, then greater thermal demands may be managed at the tablet information handling system, such as greater CPU clock speeds for a given CPU, internal housing or skin temperature. For example, a piezoelectric bellows-based fan having substantially the same footprint as a WWAN NIC and powered from the communications slot interface aids distribution of thermal energy whether or not the tablet housing has air vents.

7 Claims, 14 Drawing Sheets

(56) References Cited

U.S. PATENT DOCUMENTS

| | | | | |
|---|---|---|---|---|
| 2010/0107238 A1* | 4/2010 | Stedman | ............... | G06F 21/32 |
| | | | | 726/13 |
| 2010/0115314 A1* | 5/2010 | Sultenfuss | ............ | G06F 1/3203 |
| | | | | 713/323 |
| 2011/0014866 A1* | 1/2011 | Sultenfuss | ............ | H04W 52/42 |
| | | | | 455/41.2 |
| 2012/0099261 A1* | 4/2012 | Reber | .................. | G06F 1/1632 |
| | | | | 361/679.3 |
| 2012/0140414 A1* | 6/2012 | Ishikawa | ................. | F04F 7/00 |
| | | | | 361/691 |
| 2015/0041104 A1* | 2/2015 | De Bock | ............. | B05B 17/0653 |
| | | | | 165/104.34 |
| 2015/0351215 A1* | 12/2015 | Durham | ............... | H05K 1/0203 |
| | | | | 361/697 |
| 2016/0371089 A1* | 12/2016 | Ma | ....................... | G06F 9/3808 |

\* cited by examiner

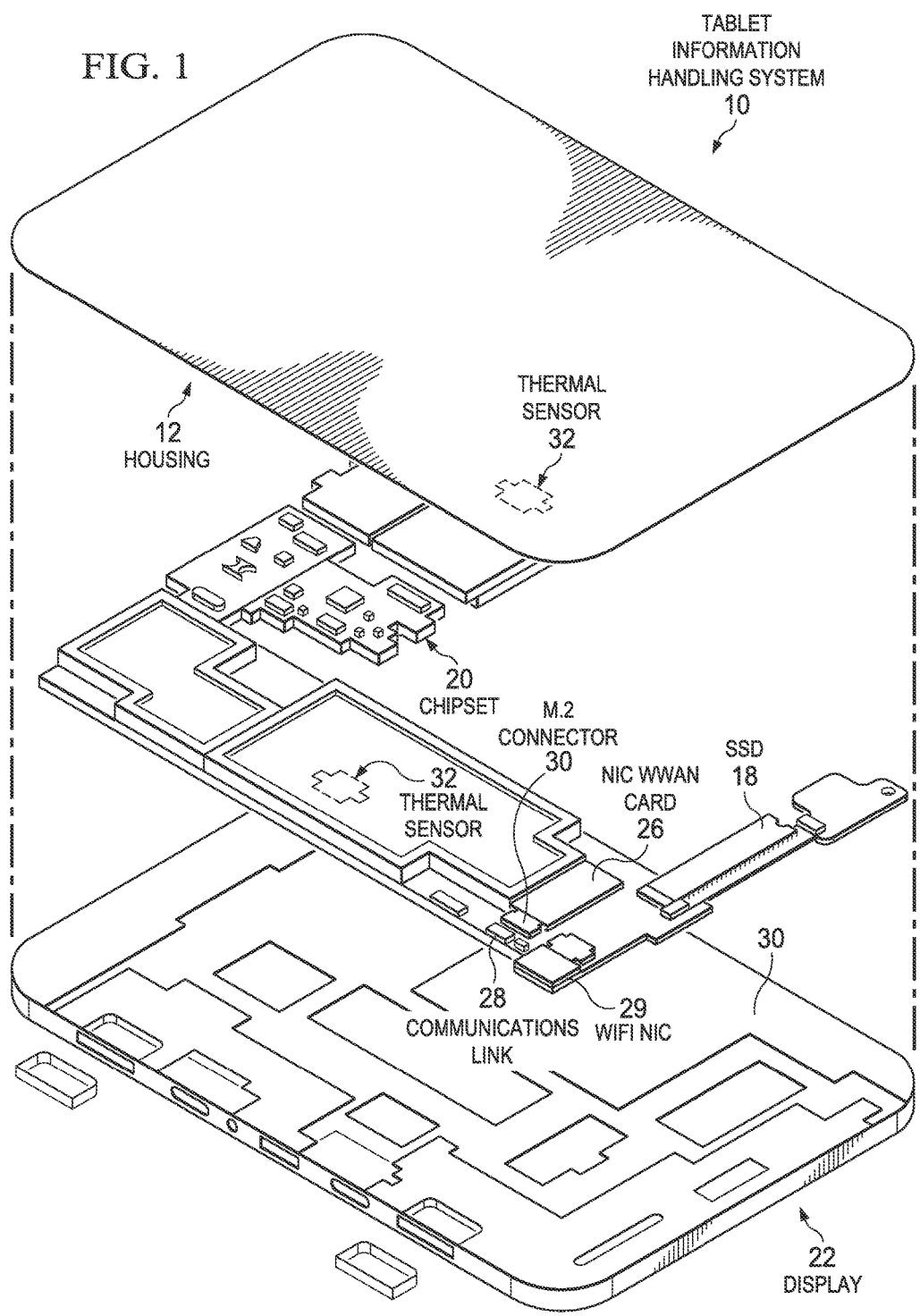

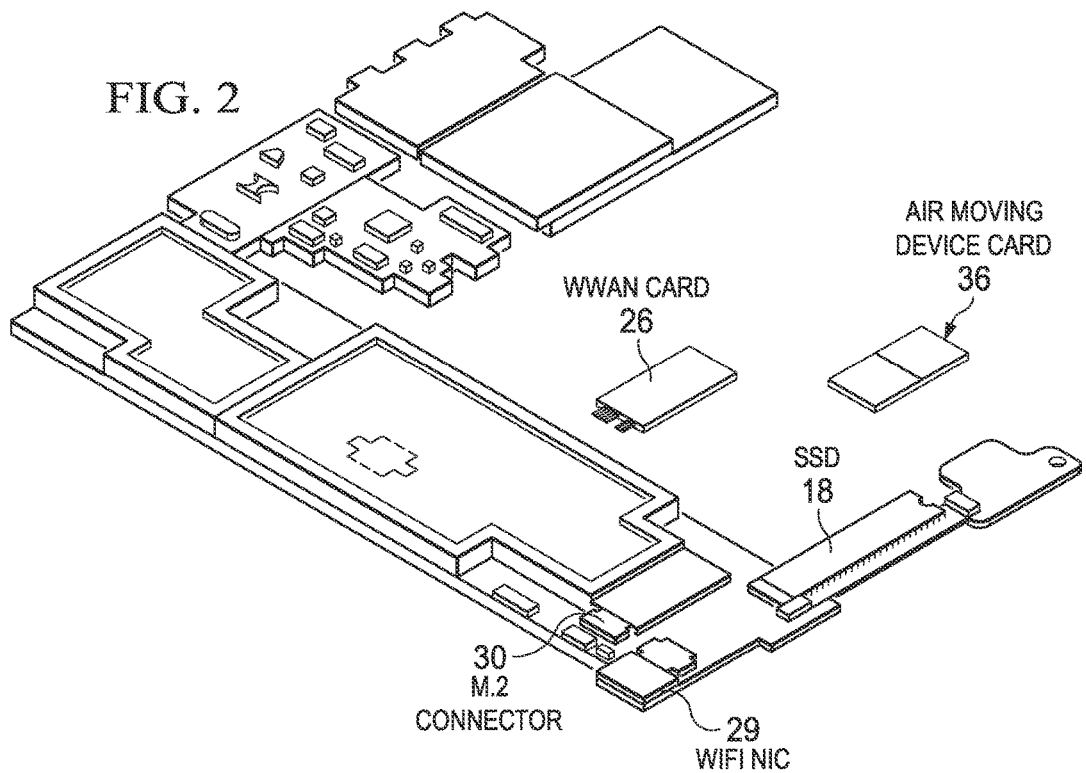
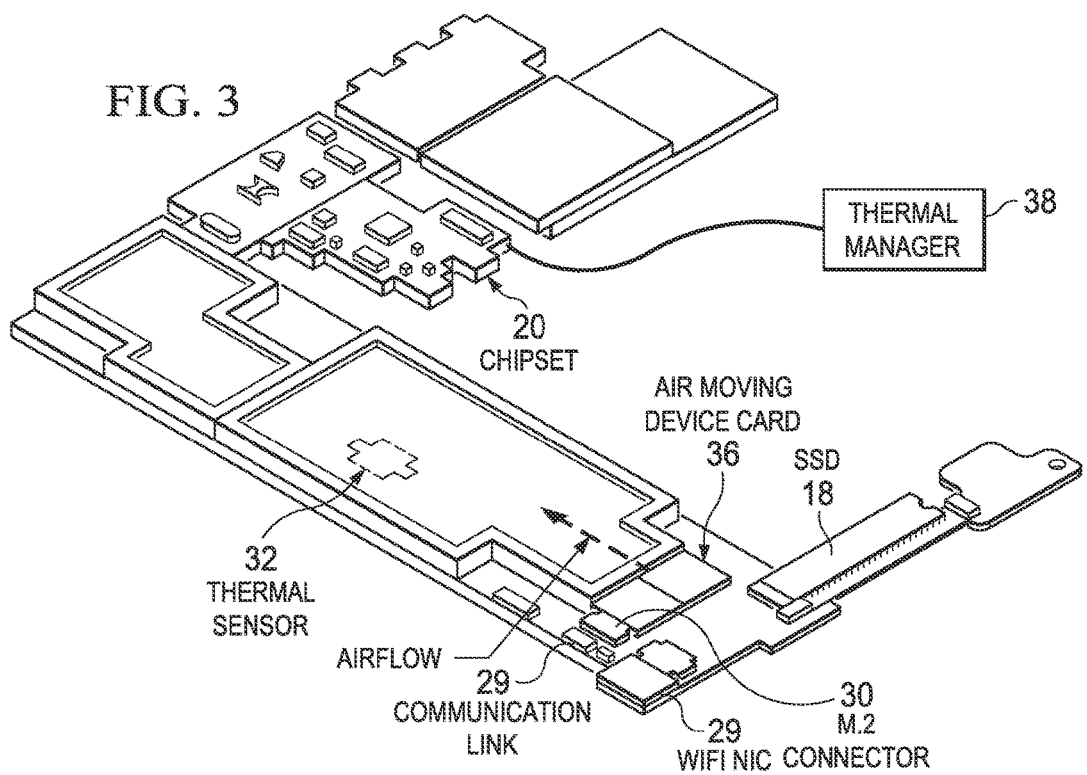

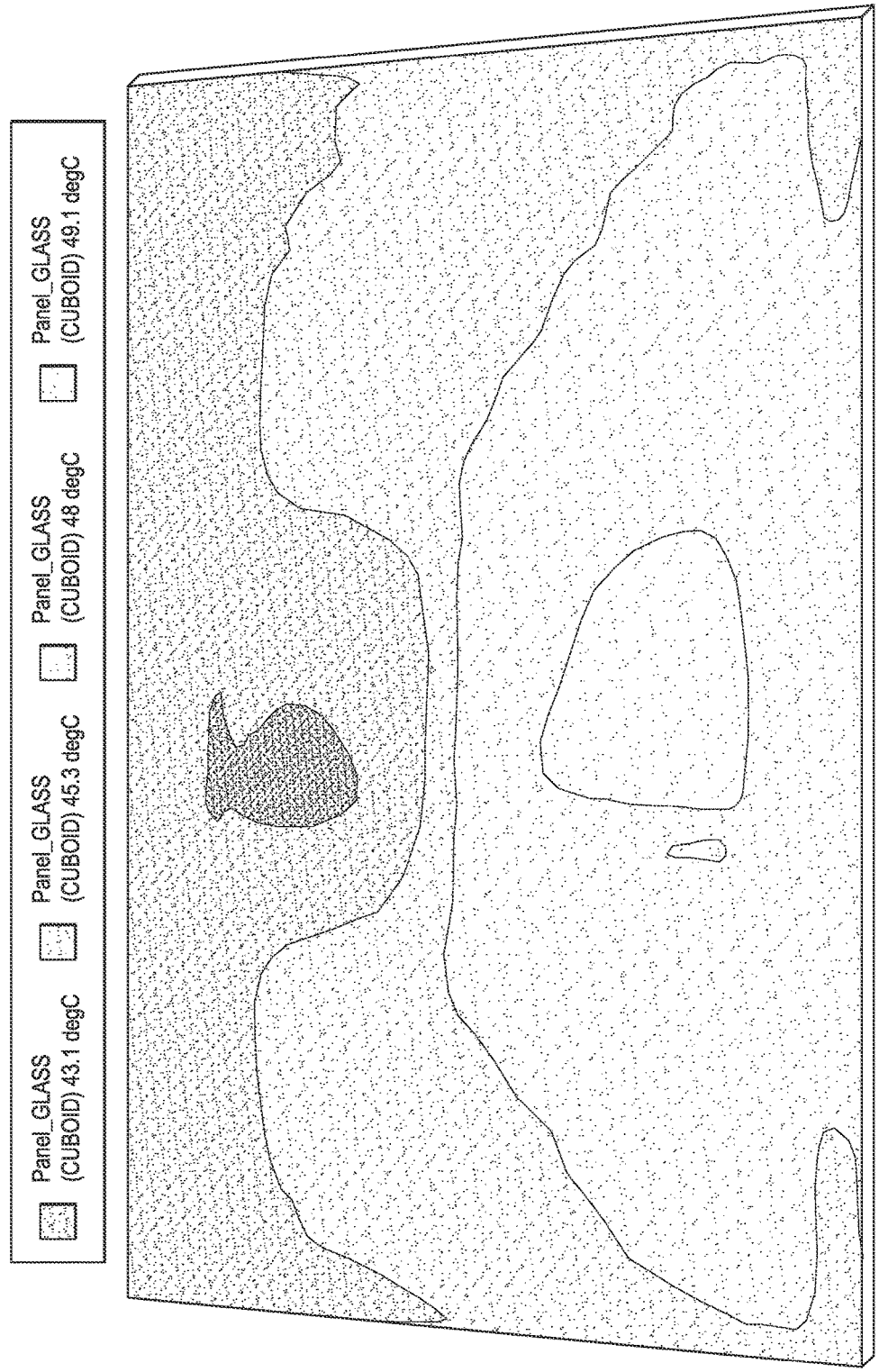

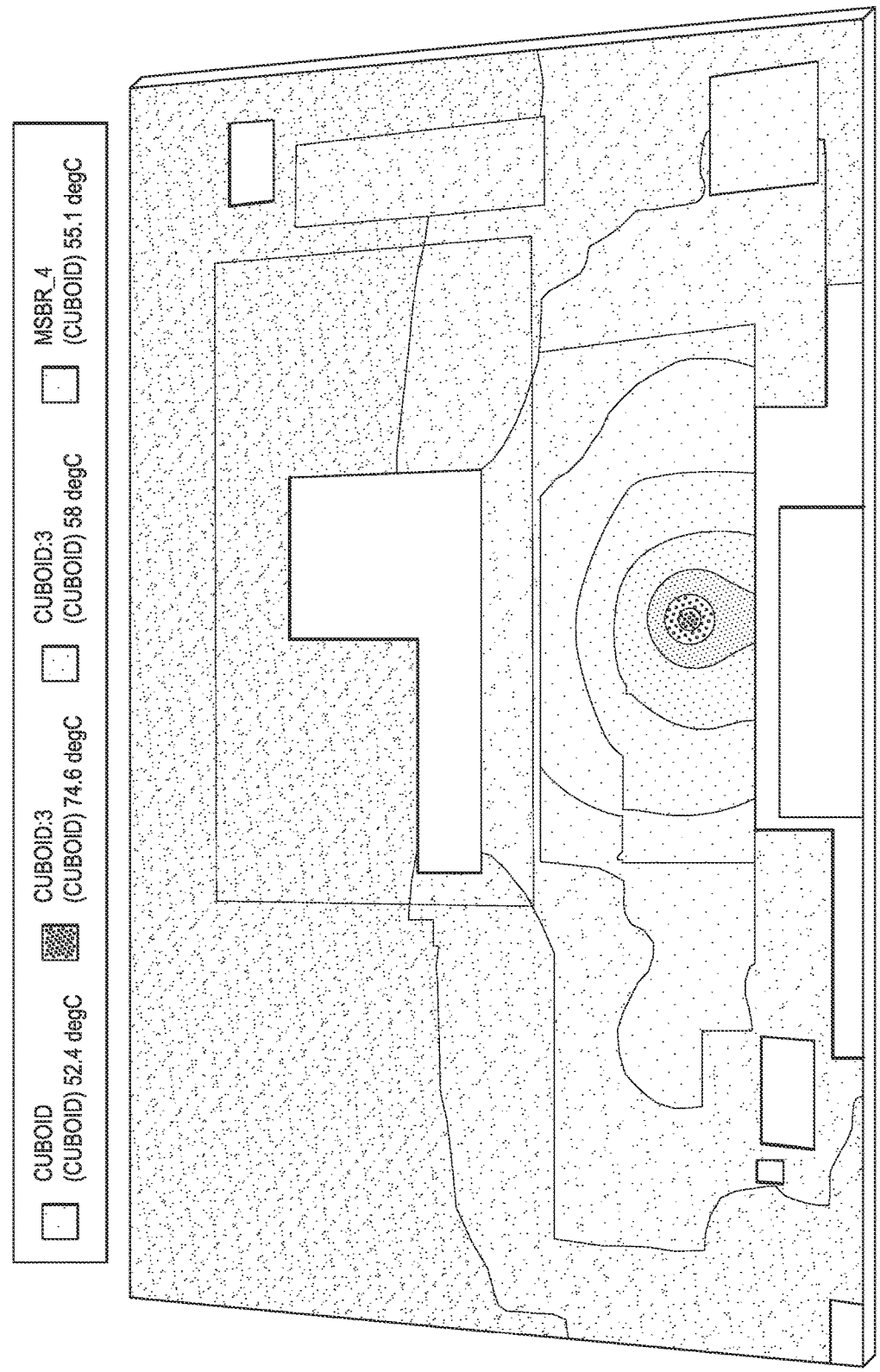

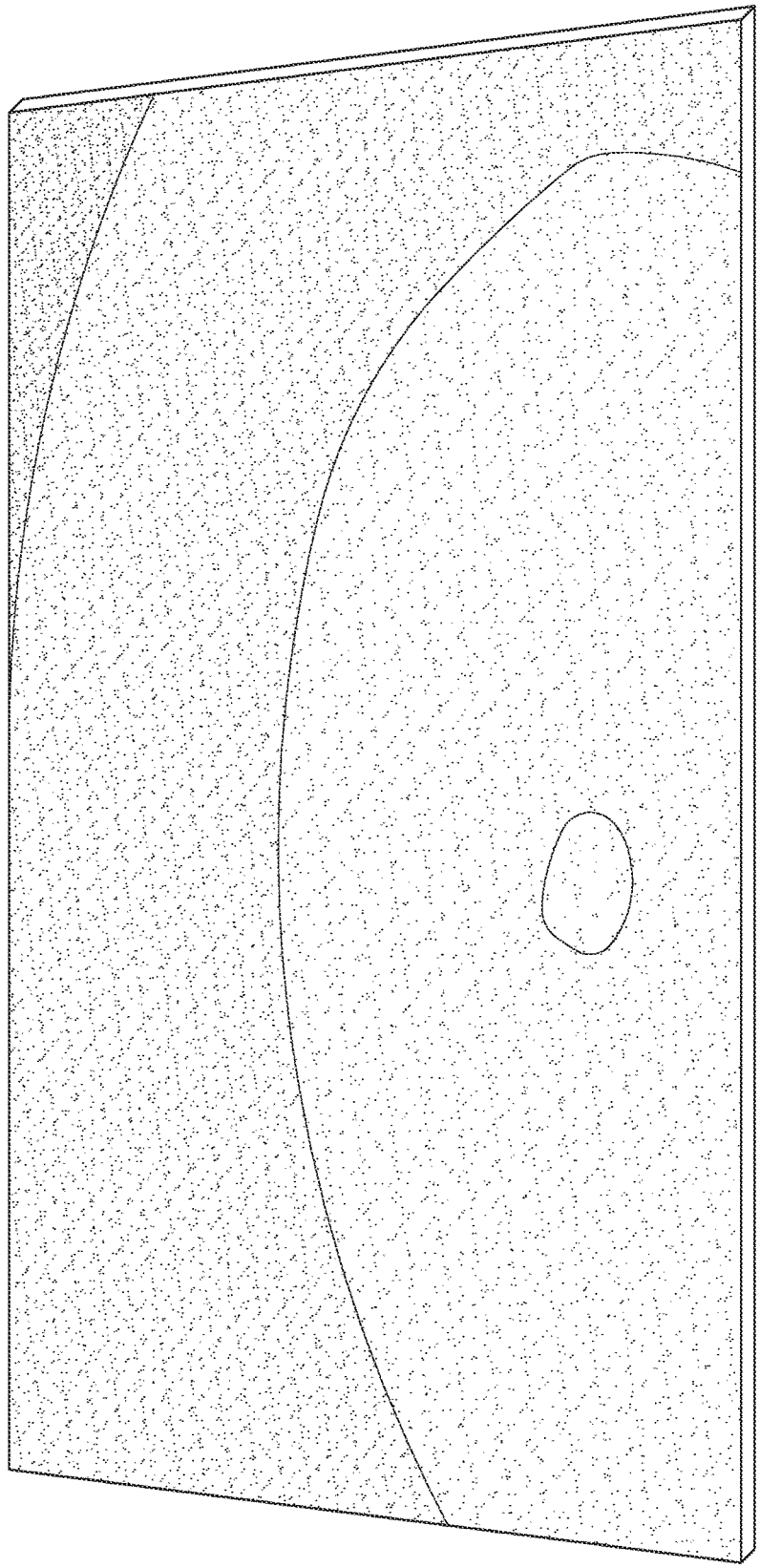

INFORMATION HANDLING SYSTEM THERMAL CONTROL WITH ADAPTIVE NON-ROTATIONAL COOLING DEVICES

BACKGROUND OF THE INVENTION

Field of the Invention

The present invention relates in general to the field of information handling system thermal management, and more particularly to an information handling system thermal control with adaptive non-rotational cooling devices.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data, storage, or global communications. In addition, information handling systems may include a variety of hardware and software components that may be configured to process, store, and communicate information and may include one or more computer systems, data storage systems, and networking systems.

Information handling systems continue to shrink in size and increase in performance. Some information handling systems, such as smartphones, have small housings to provide desired end user functionality, such as for use as a handset. Smaller housings typically include a displayed input/output (I/O) device that allows an end user to interact with, the system, such as keyboard displayed on a touchscreen. Tablet information handling systems are similar to smartphone information handling systems but generally include a larger housing that integrates a larger touchscreen display. Tablet information handling systems, due to the housing size, generally do not include a microphone and speaker aligned for use as a headset; however, tablet information handling systems do sometimes include wireless wide area network (WWAN) communications that enable the same telephone and data functions as smartphones. That is, similar to other types of portable information handling systems, such as clamshell or convertible laptops, tablet information handling systems are sometimes configured with WWAN capability so that an end user can interface through a mobile telephone network with the Internet when shorter range wireless communications are not available, such as wireless local area, network (WLAN) hotspots. Often, tablet information handling systems have a slot available for a WWAN network interface card (NIC) that is generally unpopulated unless an end user selects a mobile telephone service provider at the time of purchase of the system.

One difficulty with tablet information handling systems is that the small footprint of the systems tends to make more difficult the dissipation of thermal energy generated by powering processing components. Typically, the amount of thermal energy output as a byproduct of running a central processing unit (CPU) increases with the processing capability of a CPU. Typically, the ability to dissipate thermal energy from a tablet housing decreases with decreased size of the housing. For example, a smaller housing generally has less mechanical structure for accepting thermal energy and less room for air to circulate within a housing. As a result, information handling system manufacturers generally limit CPU capability as housing size shrinks. In addition, tablet information handling systems typically include thermal control systems that monitor the temperatures within a housing and adjust system operations to maintain temperatures within desired constraints, such as operating limits for the CPU or skin temperatures that will not cause discomfort to end users. In some larger tablet information handling systems, a mechanical cooling fan blade rotates to move air through the housing for improved thermal transfer. Generally, however, smaller tablet information handling systems do not include a rotational fan or even vents that provide a passive airflow between the housing and the external environment. In systems that rely on passive cooling, excessive temperatures within the housing typically result in throttling of the CPU and other processing components so that less thermal energy is generated within the housing. Such throttling typically impacts system performance and provides a degraded user experience.

SUMMARY OF THE INVENTION

Therefore a need has arisen for a system and method which enhances cooling within an information handling system housing without the use of a rotational cooling fan.

In accordance with the present invention, a system and method are provided which substantially reduce the disadvantages and problems associated with previous methods and systems for removing excess thermal energy from within a tablet information handling system housing. An unpopulated internal communications card slot accepts an air moving device having a form factor of a card that operates to move air within the housing for enhanced management of excess thermal energy.

More specifically, a tablet information handling system is built with a processor and memory disposed in a planar housing to execute instructions for processing and storing information. A thermal manager executing on a processing component within the housing monitors thermal parameters, such as one or more temperature sensor measurements and CPU clock speed, and adjusts operating conditions of the tablet information handling system to maintain thermal thresholds. The thermal manager determines whether a communications card slot, such as an M.2 communications card slot adapted to accept a wireless wide area network (WWAN), is populated with a communications card or a bellows-based air moving device. The thermal manager adjusts thermal parameter and threshold settings based upon whether an air moving device couples to the communication slot. For example, if an air moving device is coupled to the communications card slot, the thermal manager commands operation of the air moving device at a thermal threshold, such as housing skin external temperature, a housing internal temperature or a CPU temperature. As another example, the thermal manager adjusts permitted temperatures to a higher level if an air moving device is operational, such as by allowing an increased CPU temperature before throttling the CPU clock. In one embodiment the thermal manager is firmware that executes on a chipset and manages the operation of the bellows-based air moving device through a communications link interfaced with the card slot.

The present invention provides a number of important technical advantages. One example of an important technical advantage is that an unpopulated component slot within a tablet information handling system is provided with a dual purpose of aiding dissipation of excess thermal energy. End users who elect not to have a WWAN NIC installed are instead provided with a non-rotational air moving device to increase thermal energy dissipation. Reduced thermal energy within the tablet information handling system allows the use of more powerful CPUs and reduces the need to throttle CPU operations due to excess thermal energy. Improved thermal energy dissipation is provided whether or not the tablet information handling system has air vents or is sealed.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 1 depicts a blown-up rear view of a tablet information handling system having processing components disposed in planar housing;

FIG. 2 depicts the tablet information handling system with a WWAN NIC replaceable by a non-rotational cooling device card;

FIG. 3 depicts the tablet information handling system having an air moving device card installed in the communications card connector to generate airflow within the housing;

FIGS. 6A, 6B and 6C depict example thermal conditions of a tablet information handling system with a WWAN NIC installed;

FIGS. 7A, 7B and 7C depict example thermal conditions of a sealed tablet information handling system with an air moving device installed in a WWAN card slot.

DETAILED DESCRIPTION

Figure 4:
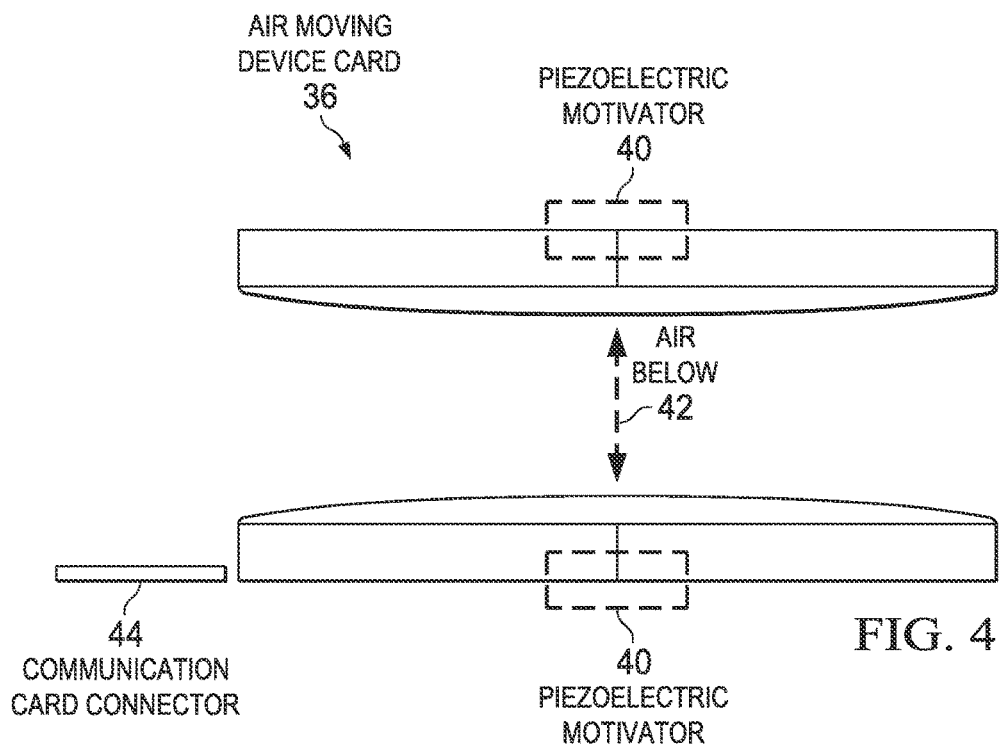
FIG. 4 depicts a side view of an example embodiment of a non-rotational air moving device.

A tablet information handling system is selectively populated with a WWAN NIC or an air moving device card that fits in the WWAN NIC card slot so that systems built without WWAN capabilities are provided with additional thermal cooling. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring now to FIG. 1, a blown-up rear view depicts a tablet information handling system 10 having processing components disposed in planar housing 12. For example, a central processing unit (CPU) 14 interfaces with memory 16, such as random access memory (RAM), to store and execute instructions for processing information. Persistent storage, such as a solid state drive (SSD) 18, stores instructions and information when power is not available. A chipset 20 includes processors that execute firmware instructions, such as a BIOS, to manage coordination of input and output (I/O) devices with CPU 14 and memory 16. A display 22 interfaces with graphics components of chipset 20 to present information as visual images and act as a primary input device through touchscreen functionality. Tablet information handling system 10 is assembled by placing housing 12 over the various processing components to couple with display 22.

In operation, tablet information handling system 10 communicates with external devices with wireless networking communication signals. For example, a WiFi network interface card (NIC) 24 supports communications with external networking devices that use the WiFi bands, such as 2.4 GHz and 5 GHz. WiFi NIC 24 may include support to interact with wireless local area networks (WLAN), such as 802.11 b, g and n devices, or with peripherals in a peer-to-peer connection, such as a Bluetooth keyboard and mouse. A wireless wide area network (WWAN) NIC 26 supports communications with external mobile telephone service provider networks, such as 3G or 4G networks. WiFi NIC 24 and W WAN NIC 26 each couples with a communications link 28 at a communications connector 30 so that the wireless networking components are able to communicate with chipset 20 and CPU 14. For example, connector 30 is an M.2 connector that accepts standardized expansion card form factors to interface with SATA, SATA Express, PCIe or USB communication links 28. In the example embodiment, connector 30 provides tool-less coupling of a communications or other type of daughter card so that the card has power, ground and a serial communications link with other devices.

While tablet information handling system 10 is processing information, thermal energy is released as a byproduct of dissipation of electrical energy applied to processing components. Thermal sensors 32 are disposed proximate processing components and housing 12 to monitor temperatures that result from the excess thermal energy. For example, a thermal sensor proximate CPU 14 monitors for the operating temperature of the CPU to ensure that an over temperature does not occur, and a thermal sensor 32 monitors the back surface 34 of housing 12 to ensure that an end user does not experience discomfort due to high housing skin temperatures. In the example embodiment, tablet information handling system relies upon passive cooling to maintain thermal conditions within desired parameters so that, if an excessive temperature occurs, the corrective action is typically to reduce power consumption of the processing components to release less thermal energy. For instance, to reduce the generation of thermal energy the clock speed of CPU 14 is typically slowed.

Referring now to FIG. 2, tablet information handling system 10 is depicted with WWAN NIC 26 replaceable by a non-rotational air moving device card 36. Typical mechanical cooling devices include a cooling fan that has an electric motor to rotate a fan blade for moving air. Non-rotational air moving device card 36 does not apply rotational movement, such as a rotating electric motor and fan blade, to move air but rather relies upon a piezoelectric or electromagnetic force to activate an air bellows structure that moves air. For example, a diaphragm moves under the influence of stress and strain introduced by a piezo element or via an electromagnetic force of a coil so that air proximate the diaphragm is moved. The absence of a mechanical rotating fan motion allows air moving device card 36 to provide movement of air in a form factor substantially that of a wireless network card, such as WWAN NIC 26. In order to add non-rotational air moving device card 36, WWAN card 26 is removed from connector 30 and non-rotational air moving device card 36 is inserted. Connector 30 provides both power and communications so that additional cooling is provided by non-rotational air moving device card 30 based upon remote control instructions, such as firmware control instructions executing on chipset 20.

In most instances, end users do not access the interior of housing 12 after purchasing a tablet information handling system 10. Although end users may not desire to open housing 12 and selectively replace WWAN NIC 26 with air moving device card 36, tablet information handling system manufacturers may elect to install air moving device cards 36 when tablet information handling systems 10 are built without WWAN capabilities. Often, end users do not order WWAN capabilities, preferring instead to rely upon mobile telephone devices for access to the Internet if a WLAN hotspot is not available for a tablet device. By including an air moving device card 36 instead of leaving the WWAN NIC 26 slot empty, the manufacturer provides a table information handling system 10 that is able to operate CPU 14 at greater clock speeds while maintaining desired thermal parameters.

Referring now to FIG. 3, the tablet information handling system 10 is depicted having an air moving device card 36 installed in the communications card connector 30 to generate airflow 38 within housing 12. As depicted by the example embodiment, airflow 38 is directed from WWAN NIC communication connector 30 towards CPU 14 to help reduce the temperature proximate CPU 14. In alternative embodiments, airflow 38 may be directed towards back surface 34 of housing 12 to reduce housing outer skin temperatures or towards other areas within housing 12. In example embodiments that have sealed housings, air moving device card 36 aids with dissipation of thermal energy across the system so that hot spots are less likely to form and so that CPU 14 thermal energy is less concentrated. In example embodiments that have vented housings, airflow 36 may be directed across areas that have excess thermal energy, such as CPU 14, and then out of the vent. Although the example embodiment depicts air moving device card 36 as used in the place of WWAN NIC 26, in alternative embodiments other types of card slots may be used, as may more than one air moving device card 36 inserted in more than one unpopulated card slot.

A thermal manager 38 running on a processing component, such as a BIOS firmware module running in chipset 20, adapts thermal parameters and thermal thresholds based upon whether air moving device card 36 is installed in connector 30. For example, if air moving device card 36 is installed, thermal manager 38 controls application of power to move air at predetermined thresholds, such as CPU or housing skin temperature measurements. Thermal manager 38 also adjusts thermal parameters that determine processor throttling, such as by delaying throttling processing until higher CPU temperatures are sensed. In one embodiment, the amount of throttling at given temperatures is also decreased so that the CPU is allowed to ran at higher clock speeds for a sensed CPU temperature. In one alternative embodiment, thermal manager 38 may be included in whole or in part on air moving device 36 and programmed with parameters appropriate for an intended tablet information handling system. In either embodiment, communication link 28 provides both power and a communication medium to manage operation of air moving device card 36 based upon sensed thermal conditions within tablet information handling system 10.

Referring now to FIG. 4, a side view depicts an example embodiment of a non-rotational air moving device 36. Piezoelectric or electromagnetic motivators 40 excite air bellows 42 to compress and release, resulting in movement of air through the device. A communications card connector 44 extends outward to provide a standardized interface with a communication card connector 30 of an information handling system. Communication connector 44 provides power, ground and serial communications links to manager application of power to motivator 40.

Figure 5:
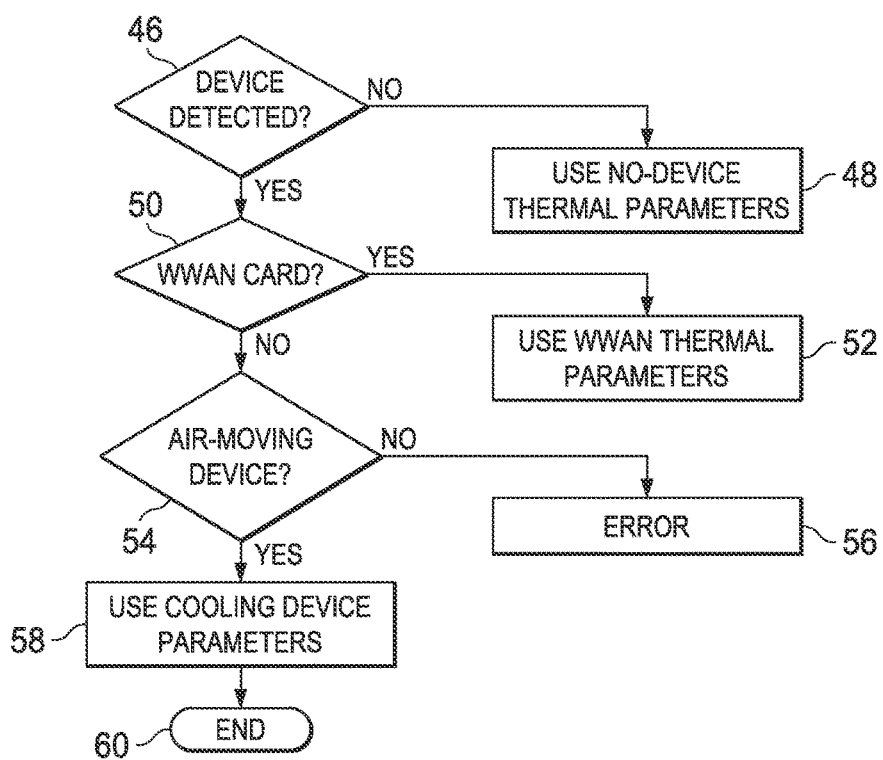
FIG. 5 depicts a flow diagram of a process for setting thermal parameters based upon whether an air moving device is installed in a communications card slot.

Referring now to FIG. 5, a flow diagram depicts a process for setting thermal parameters based upon whether an air moving device is installed in a communications card slot. The process starts at step 46 with a query to detect whether a device is inserted in a communications card slot. If no device is detect, the process continues to step 48 to no-device thermal parameters and thresholds for managing thermal conditions in the information handling system. If a device is detected, the process continues to step 50 to determine if the device in a WWAN card. If yes, the process continues to step 52 to use WWAN thermal parameters and thresholds for managing thermal conditions. WWAN thermal parameters are likely close to or the same as no-device parameters, but may have minor differences due to thermal impact from the WWAN card. If a WWAN card is not detected, the process continues to step 54 to determine if an air moving device is inserted in the communications card slot. If the device is not an air moving device, the process issues an error at step 56. If the device is an air moving device, the process continues to step 58 to set thermal parameters and thresholds to those associated with the presence of an air moving device.

Figure 6B:
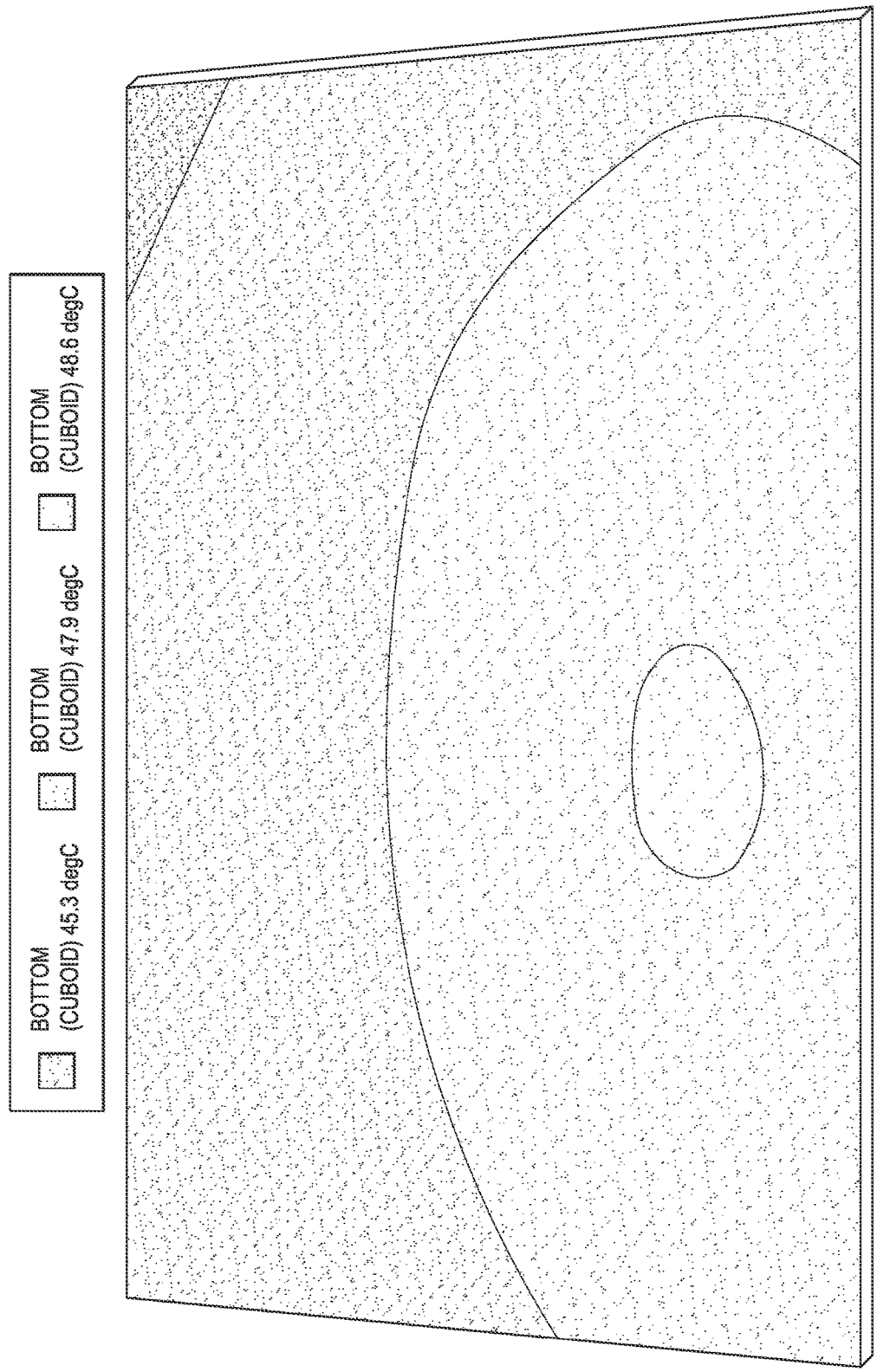

Referring now to FIGS. 6A, 6B and 6C, example thermal conditions are depicted of a tablet information handling system with a WWAN NIC installed. FIG. 6A depicts the front panel glass at the display near where CPU 14 is located as having a temperature of 49.1 degrees Celsius. The temperature of the front glass decreases as the distance increases from CPU 14. FIG. 6B depicts a similar temperature range occurs across bottom surface 34 of housing 12. FIG. 6C depicts internal temperatures within housing 12 with high-temperature zones occurring in the locations near where processing components are located. The concentration of thermal energy near the processing components results in points having high temperatures that cause CPU throttling even though the overall thermal state of tablet information handling system 10 is not excessive.

Figure 7A:
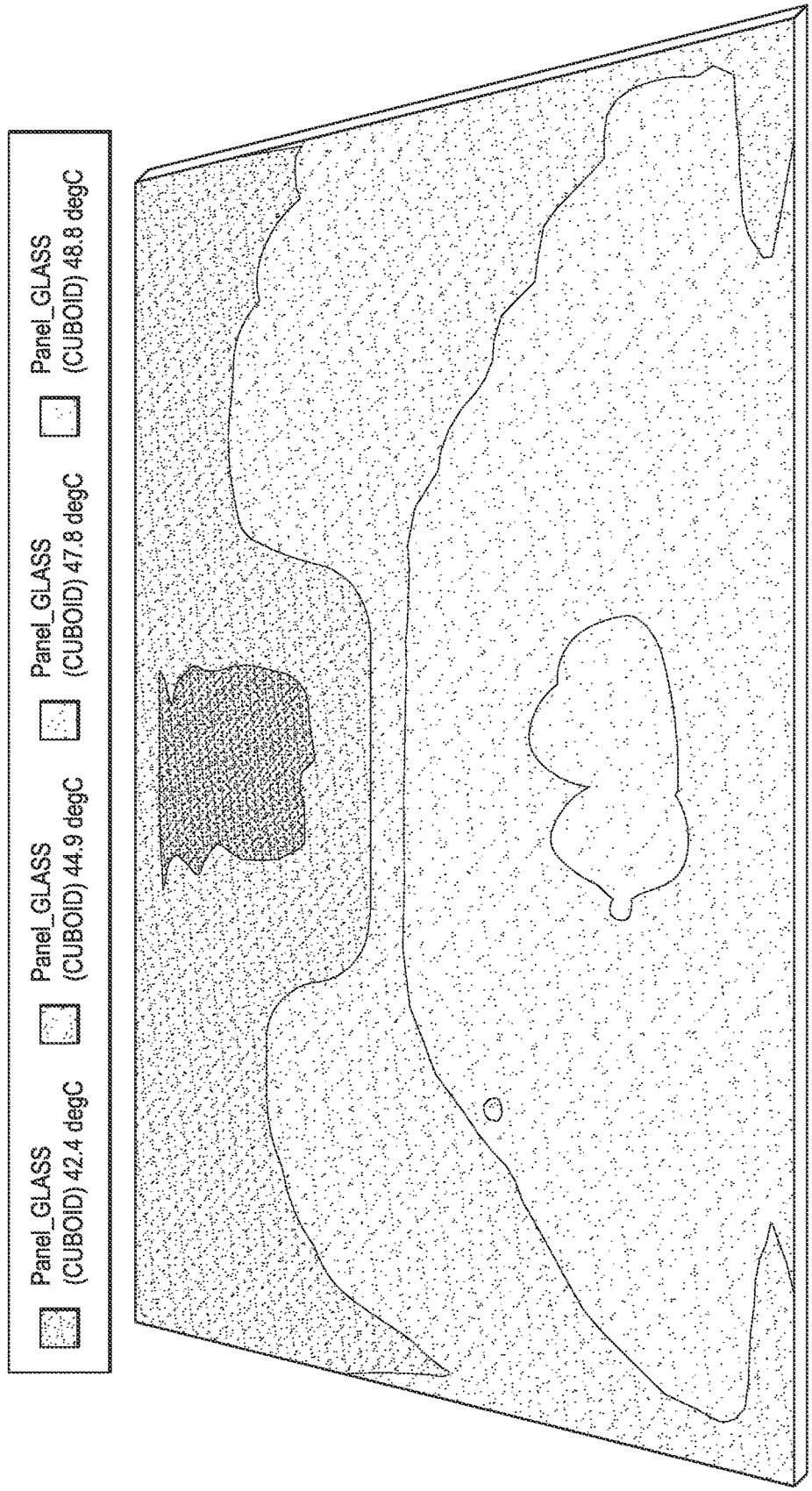
Figure 7C:
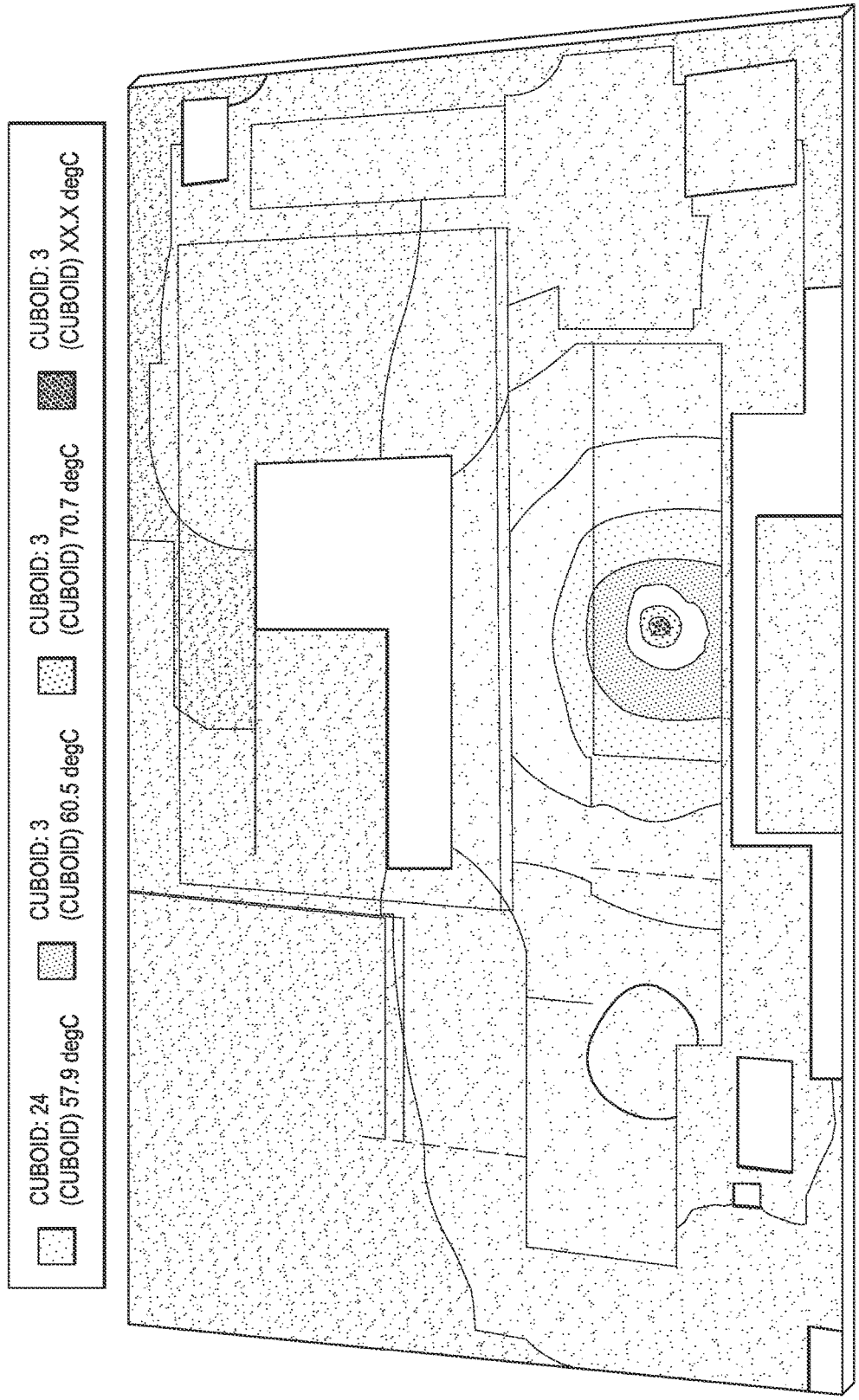

Referring now to FIGS. 7A, 7B and 7C, example thermal conditions are depicted of a sealed tablet information handling system with an air moving device installed in a WWAN card slot. Temperatures sensed across the front, back and interior of tablet information handling system 10 are generally reduced as the airflow from the air moving device tends to dissipate the thermal energy more quickly. Reduced concentrations of thermal energy allow delays in throttling of CPU 14 relative to the housing of FIG. 6 that lacks an air moving device.

Figure 8A:
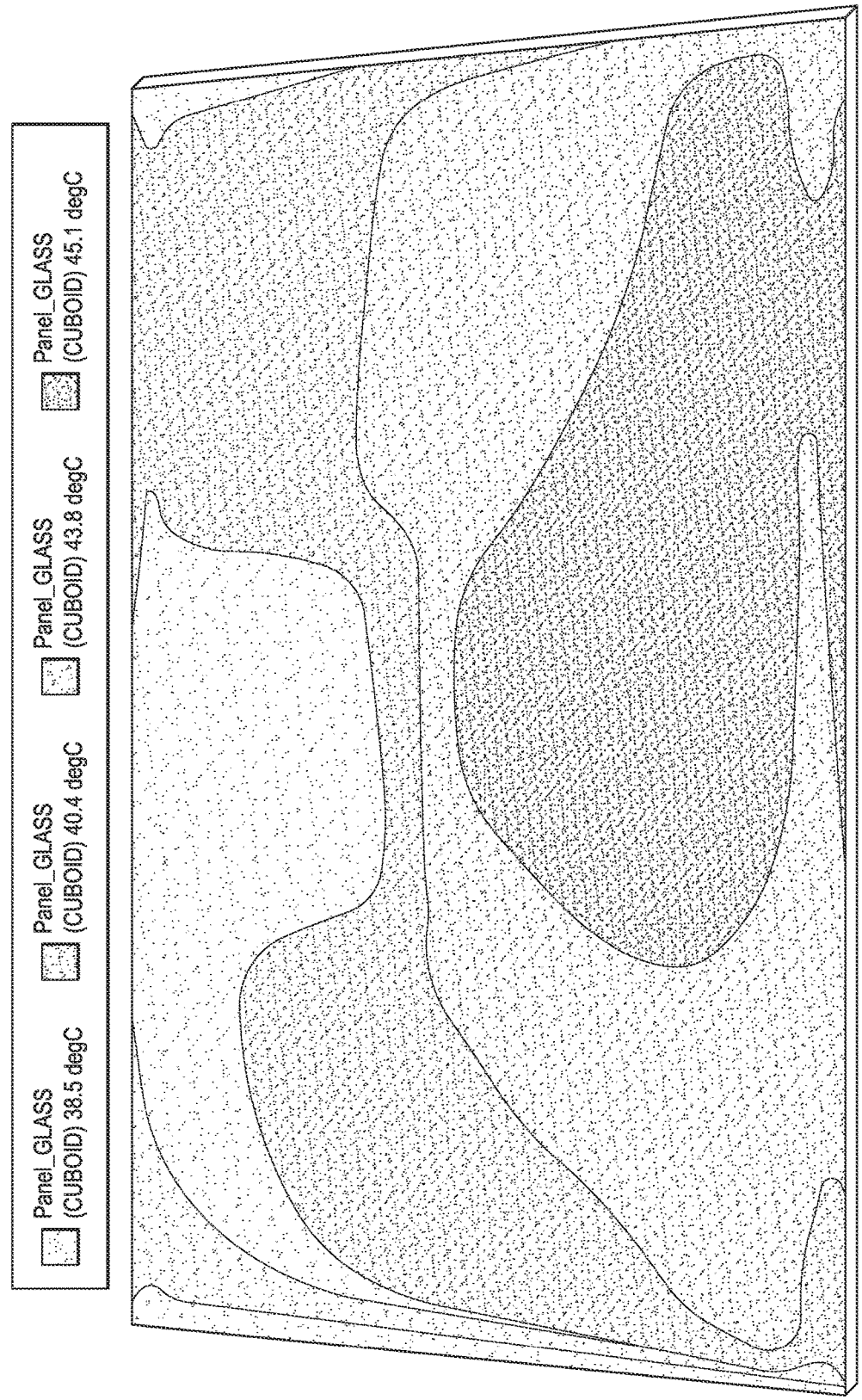
FIGS. 8A, 8B, 8C, 8D and 8E depict example thermal conditions of a vented tablet information handling system with an air moving device installed in a WWAN card slot.
Figure 8B:
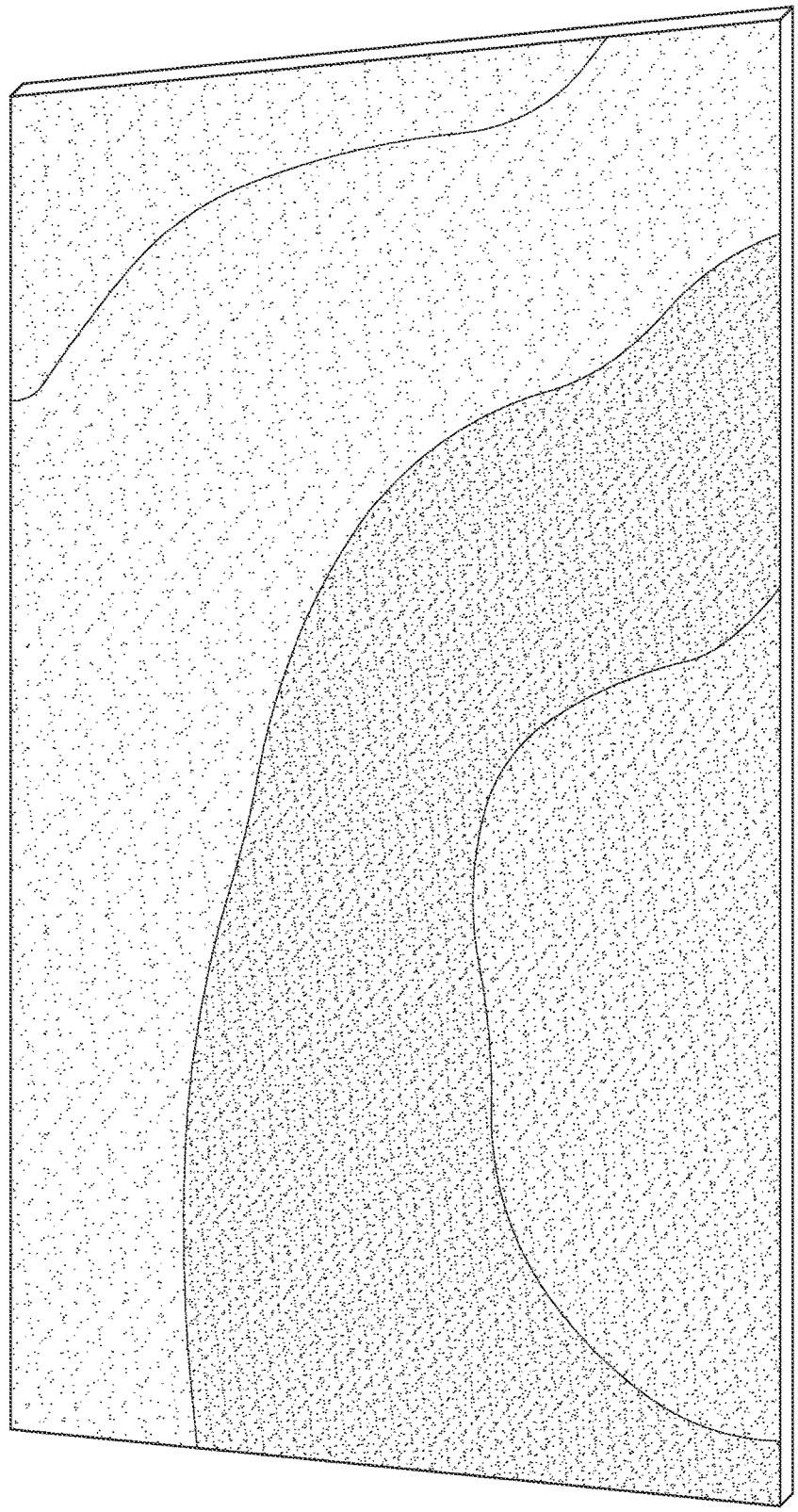
Figure 8C:
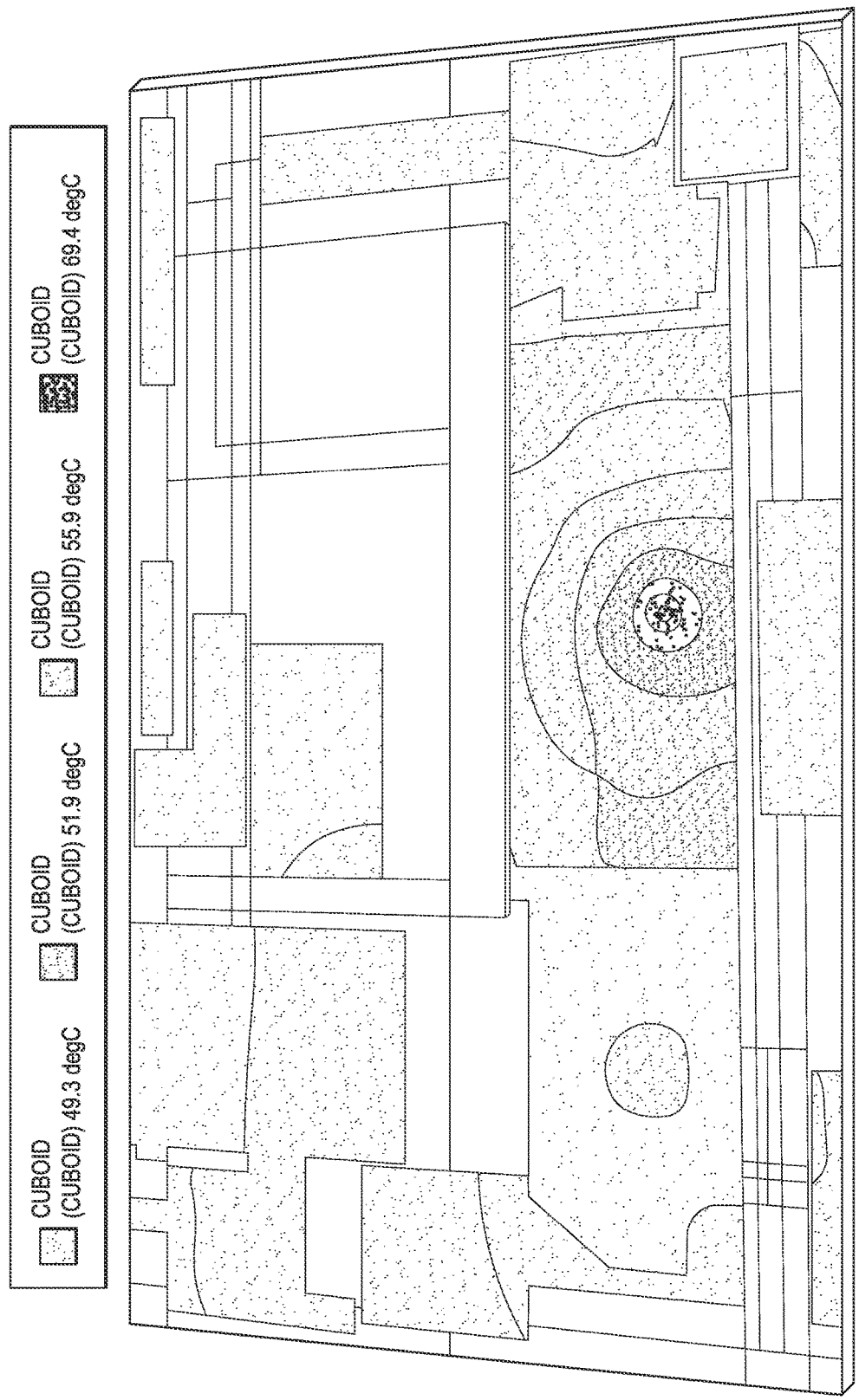
Figure 8D:
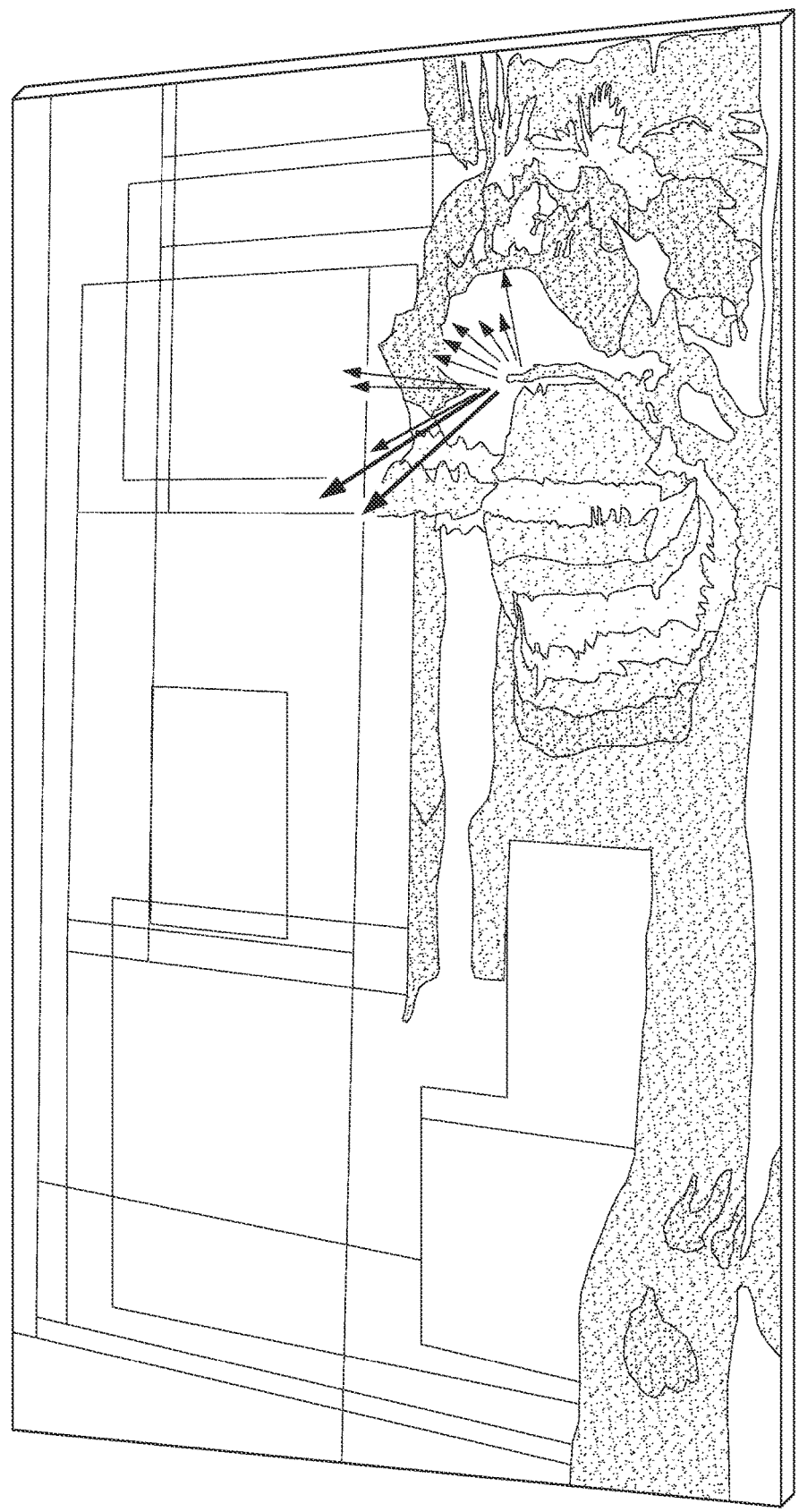
Figure 8E:
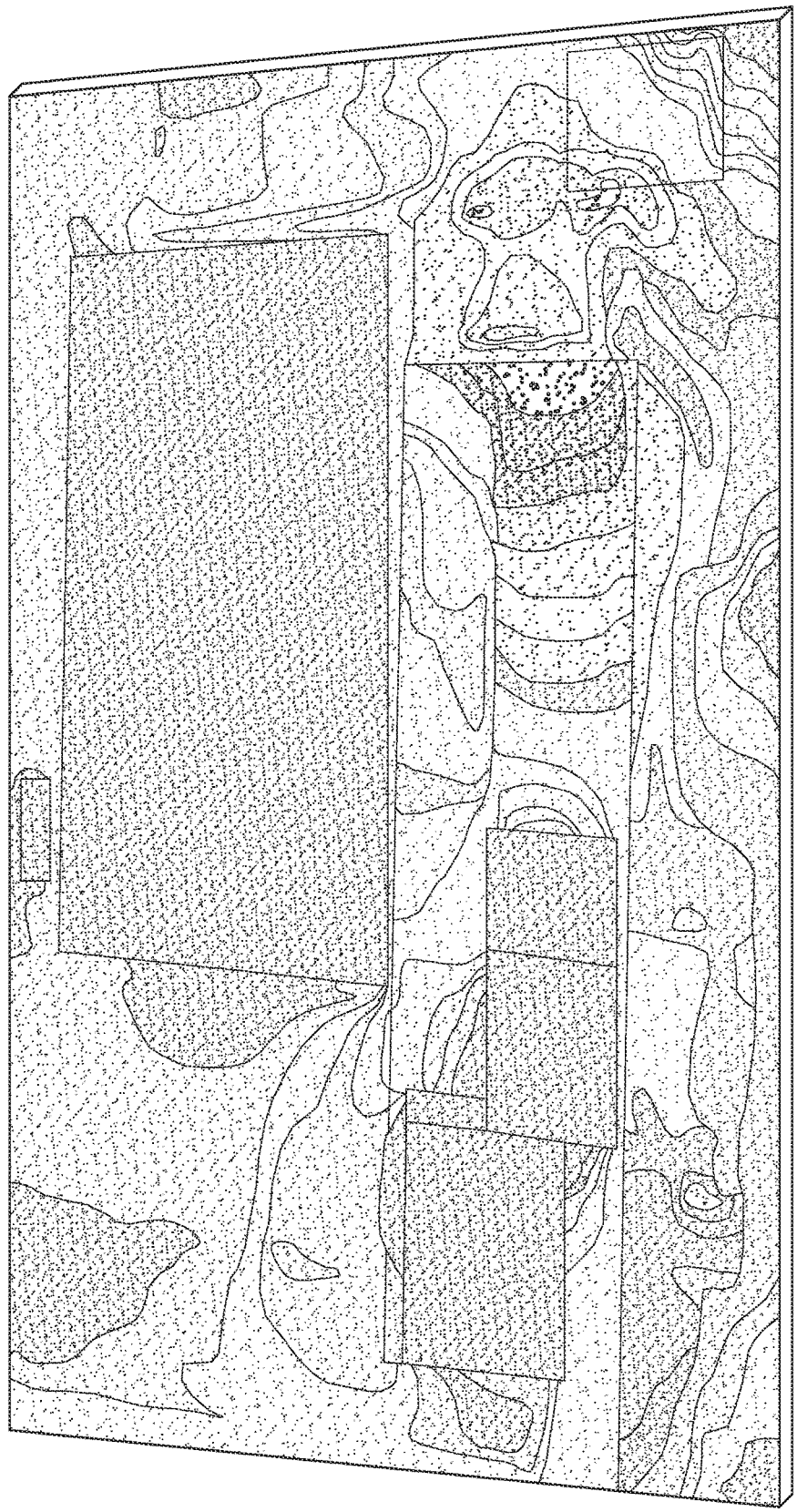

Referring now to FIGS. 8A, 8B, 8C, 8D and 8E, example thermal conditions are depicted of a vented tablet information handling system with an air moving device installed in a WWAN card slot. Including the air moving device with a vented housing provides greater dissipation of thermal energy than that of the sealed housing with the air moving device as depicted by FIG. 7. FIGS. 8D and 8E depict the speed of the airflow in the housing at different heights. Adjusting the direction and magnitude of the airflow by adjusting the operating parameters of the air moving device further enhances system operations by allowing maintenance of desired thermal conditions while limiting power consumed by the air moving device and noise from the movement of air.

Although the present invention has been described in detail, it should be understood that various changes, substitutions and alterations can be made hereto without departing from the spirit and scope of the invention as defined by the appended claims.

What is claimed is:

1. An information handling system comprising:
   a housing;
   a processor disposed in the housing and operable to execute instructions that process information;
   a memory disposed in the housing and interfaced with the processor, the memory operable to store instructions and information;
   a communications link disposed in the housing and interfacing the processor and the memory with plural card slots, each card slot operable to accept a card having a processing function and to interface the card with the communication link, at least one of the card slots sized to accept a wireless wide area network communication card, the wireless communication card supporting wireless wide area network communication; and
   a non-rotational air moving device inserted in the card slot in the place of the wireless wide area network communication card, the non-rotational air moving device receiving power from the card slot and applying the power to move air.

2. The system of claim 1 wherein the non-rotational air moving device comprises a bellows-based fan.

3. The system of claim 2 wherein the bellows-based fan is driven by a piezoelectric element powered by the card slot.

4. An information handling system comprising:
   a housing;
   a processor disposed in the housing and operable to execute instructions that process information;
   a memory disposed in the housing and interfaced with the processor, the memory operable to store instructions and information;
   at least one wireless networking card slot having a communication link with the processor, the wireless networking card slot sized to accept a wireless wide area networking card operable to establish wireless communication between the processor and a wireless network external to the housing, the communication link having a power interface to accept power for powering the wireless wide area networking interface card; and
   a non-rotational air moving device inserted in the at least one wireless networking card slot in the place of the wireless wide area networking card, the non-rotational air moving device receiving power from the card slot communication link and applying the power to move air.

5. The system of claim 4 wherein the non-rotational air moving device comprises a bellows-based fan.

6. The system of claim 5 wherein the bellows-based fan is driven by a piezoelectric element powered by the card slot.

7. The system of claim 4 wherein the non-rotational air moving device has a footprint corresponding to the footprint of the wireless networking interface card.

* * * * *